US009287613B2

(12) United States Patent
Colapietro et al.

(10) Patent No.: US 9,287,613 B2
(45) Date of Patent: Mar. 15, 2016

(54) RRH CONCEALMENT MODULE/METHODS IN NATURAL CONVECTION

(71) Applicant: Andrew LLC, Hickory, NC (US)

(72) Inventors: Julian R. Colapietro, Center Valley, PA (US); Walter Mark Hendrix, Richardson, TX (US); Deepak Kumar Sivanandan, Richardson, TX (US)

(73) Assignee: CommScope Technologies LLC, Hickory, NC (US)

( * ) Notice: Subject to any disclaimer, the term of this patent is extended or adjusted under 35 U.S.C. 154(b) by 10 days.

(21) Appl. No.: 14/303,076

(22) Filed: Jun. 12, 2014

(65) Prior Publication Data

US 2015/0017937 A1 Jan. 15, 2015

Related U.S. Application Data

(60) Provisional application No. 61/840,763, filed on Jun. 28, 2013.

(51) Int. Cl.
| | |
|---|---|
| *H04B 1/03* | (2006.01) |
| *H04W 16/26* | (2009.01) |
| *H05K 5/00* | (2006.01) |
| *H01Q 1/24* | (2006.01) |
| *H01Q 1/02* | (2006.01) |

(52) U.S. Cl.
CPC . *H01Q 1/246* (2013.01); *H01Q 1/02* (2013.01)

(58) Field of Classification Search
USPC .............................................. 455/561, 562.1
See application file for complete search history.

(56) References Cited

U.S. PATENT DOCUMENTS

| | | | | |
|---|---|---|---|---|
| 6,105,934 A | * | 8/2000 | Rober ...................... | B66F 7/04 254/2 R |
| 7,653,083 B2 | | 1/2010 | Liu et al. | |
| 2002/0151332 A1 | * | 10/2002 | Eddy .................... | H01Q 1/1242 455/561 |
| 2004/0192392 A1 | * | 9/2004 | Hoppenstein ........ | H01Q 1/1242 455/562.1 |
| 2008/0014866 A1 | * | 1/2008 | Lipowski ............. | H03F 1/3247 455/19 |
| 2008/0168199 A1 | | 7/2008 | Conyers et al. | |
| 2012/0196522 A1 | | 8/2012 | Choi et al. | |
| 2012/0208541 A1 | | 8/2012 | Luo et al. | |
| 2014/0182811 A1 | * | 7/2014 | Hager .................... | H01Q 1/02 165/47 |

FOREIGN PATENT DOCUMENTS

| | | |
|---|---|---|
| JP | 2008-506321 A | 2/2008 |
| KR | 10-2012-0072857 A | 7/2012 |

OTHER PUBLICATIONS

International Search Report regarding PCT/US2014/042118, mailed Oct. 2, 2014 (5pgs.).
Written Opinion of the International Searching Authority regarding PCT/US2014/042118, mailed Oct. 2, 2014 (6pgs.).
Machine translation of concurrently disclosed Korean application KR 10-2012-0072857 A, generated Oct. 21, 2014 (13pgs.).

* cited by examiner

*Primary Examiner* — Blane J Jackson
(74) *Attorney, Agent, or Firm* — Husch Blackwell LLP

(57) ABSTRACT

Disclosed is an apparatus with a concealment module, the concealment module including an inlet panel and an outlet panel, the outlet panel located higher than the inlet panel. Also included is a remote radio head disposed with the concealment module, mounted on a support, and located between the inlet panel and the outlet panel. A first baffle is located under the remote radio head to prevent cool air from the inlet panel from being diverted to a space between the remote radio head and the support. A second baffle is located to direct cooling air over a back of the remote radio head. A third baffle is located on top of the remote radio head to direct heated cooling air to the outlet panel. A fourth baffle is located to direct cooling air over the front of the remote radio head.

7 Claims, 3 Drawing Sheets

RRH CONCEALMENT MODULE/METHODS IN NATURAL CONVECTION

BACKGROUND OF THE INVENTION

A wireless radio network system consists of a base band unit (BBU), a remote radio head (RRH or sometimes referred to as RRU) and an antenna. As more wireless capacity is required, additional wireless sites are necessary to handle the ever-growing need for additional bandwidth and coverage. As these wireless sites move closer to urban areas and within municipalities, hiding or concealing this network equipment is often preferred. In many cases local zoning regulations require the concealment of said equipment. This concealment becomes a challenge for any active components that are generating heat. This is especially true for the remote radio head (RRH) modules, the device that broadcasts the radio frequency signal in a wireless system. These devices require adequate cooling and ventilation to operate properly. In this invention the BBU is located outside of the concealment and not at the top of the tower.

Current Concealment methods do not provide adequate cooling. When RRHs are placed inside a concealment, there are usually very little or no openings in the concealment radome to provide adequate ventilation. In instances where there are openings in the concealment radomes, they are typically too small and located below the RRHs with no exhaust vents to allow the heated air to be released. This lack of proper ventilation and airflow will result in the overheating of the RRHs, and a shortened product life.

RRH orientation also plays a large role in proper cooling. When RRHs are placed inside a concealment, they are typically not positioned to ensure that the RRHs dissipated heat does not flow from one RRH into the cooling air of another RRH.

Currently known strategies to cope with inadequate cooling have performance and cost disadvantages. With current concealed solutions not providing adequate cooling, the RRHs are often placed at ground level or outside of the concealment module. Such ground installations result in higher power consumption and energy costs, as well as decreased performance due to the transmission losses from long RF jumper cables connecting the RRHs to the antennas at the top of the tower. Additional real estate is also needed to mount the RRHs when placed at ground level. When RRHs are placed outside of the concealment module but still on the tower structure, the RRHs lose the aesthetic advantages of concealment and often violate zoning requirements.

There are also issues with accessibility. Most concealment modules are large, long cylinders. Accessing the equipment within the concealment becomes difficult as the entire cylinder must be removed. These concealment cylinders are often very heavy and require a mechanical advantage to be removed.

SUMMARY OF THE INVENTION

The subject invention is a concealed remote radio head assembly, that has a cylindrical concealment module, with first, second and third pairs of perforated panels, each pair of perforated panel having an inlet panel and an outlet panel; the outlet panel is located higher than the inlet panel, and the perforated panels are substantially equally spaced about a circumference of the concealment module. Further, first, second and third remote radio heads may be within the concealment module, mounted on a support, with each remote radio head associated with one of the pair of perforated panels. A first baffle, located under the first, second and third remote radio heads prevents cool air from the inlet panels from being diverted between the remote radio heads and the support.

CONCISE DESCRIPTIONS OF THE DRAWINGS

FIGS. 1(a) and (b) show ventilation panels and perforations in the ventilation panels according to the subject invention.

Figure 5A:
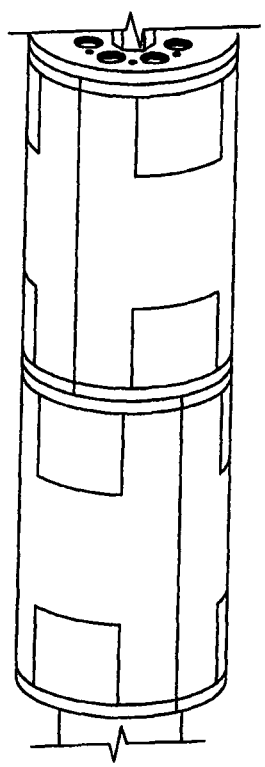
Figure 5B:
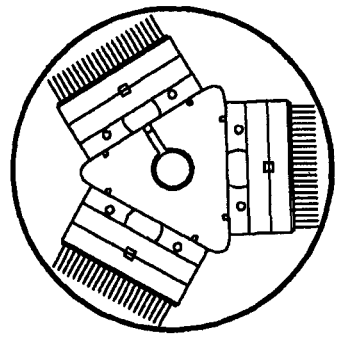
Figure 5C:
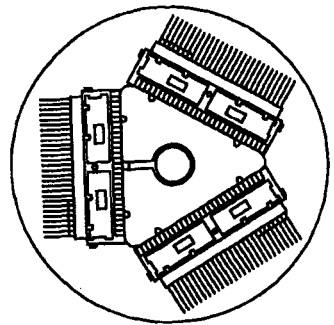

FIGS. 5(a), 5(b), and 5(c) show the positioning of vertically stacked RRHs.

DETAILED DESCRIPTION OF THE INVENTION

One way to overcome the limitations of concealing RRHs or any active heat generating components is to ensure proper ventilation, air-flow direction, and equipment orientation. One aspect of this invention relates to concealing groups of RRHs or radio modules inside a single concealed compartment. Multiple groups of RRH can be concealed using proper spacing and orientation.

Figure 2:
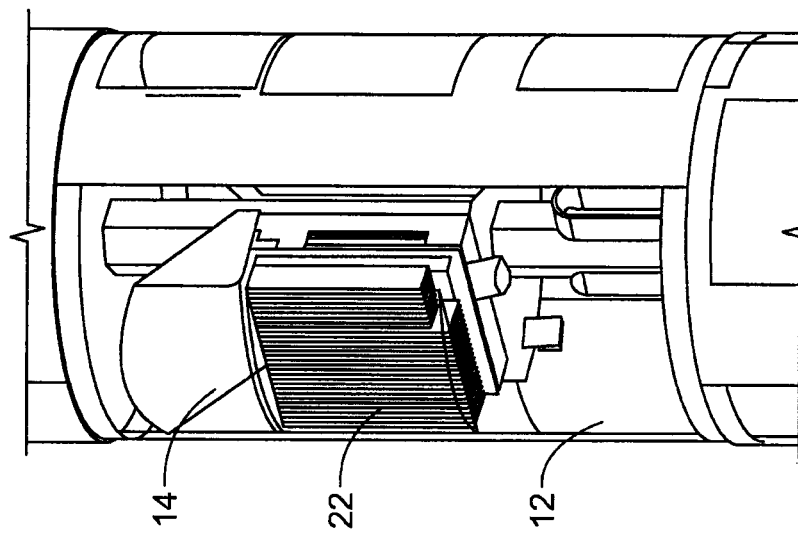
FIG. 2 shows the placement of the inlet and the exhaust with respect to the RRH.

As shown in FIG. 2, the concealment panels 10 have optimized ventilation areas to allow proper inlet 12 and outlet 14 air flow and cooling. The ventilation panels have associated baffle components 18 to ensure that all air is flowing over the heat generating equipment. The equipment is also orientated so that the exhaust air that has been heated does not flow into the ventilation panels of adjacent equipment.

The RRH modules are enclosed behind optimized ventilation panels 10. The panels contain strategically sized openings 16 to provide maximum open area, best manufacturability, insect resistance, and clog resistance. The ventilation patterns are created in pairs for each RRH module 22: One set of ventilation patterns 12 below the RRH 22 for inlet air flow and a second set of ventilation patterns 14 above the RRH 22 to exhaust the heated air. The ventilation patterns are optimized to prevent heated air from bleeding into the ventilation area of an adjacent RRH module.

Figure 1A:
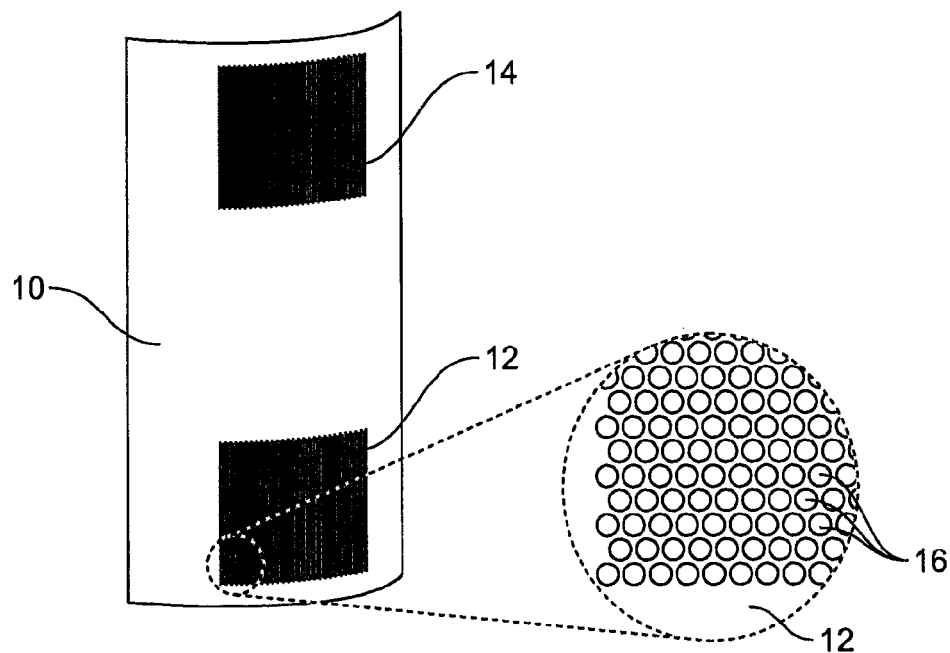
Figure 1B:
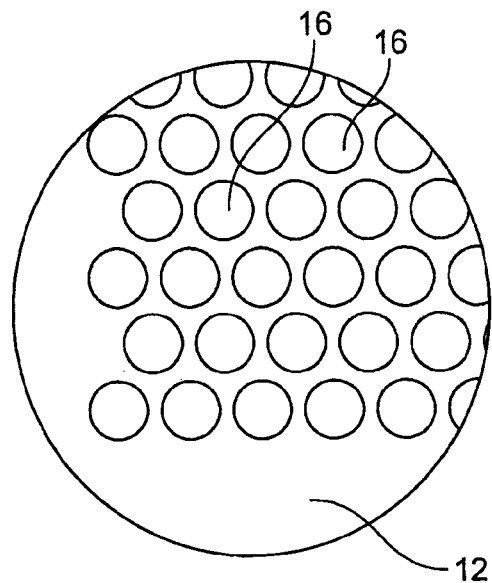
Figure 3:
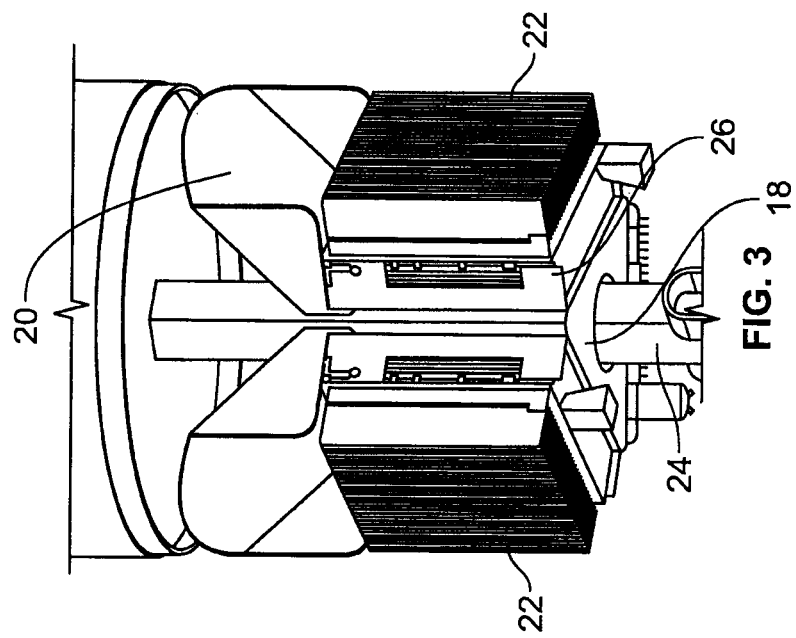
FIG. 3 shows the placement of the RRH with the request to the air baffle hood on the air baffle pole.
Figure 4:
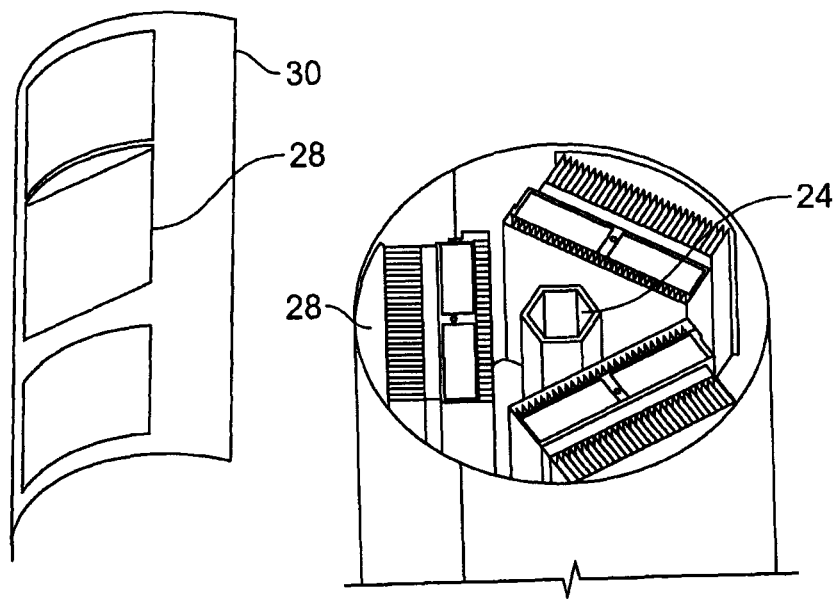
FIG. 4 shows the air baffle adjacent the RRH and within the randome.

In order to achieve proper air flow velocity over a concealed RRH 22, air baffling is required to prevent cool air from bleeding off into other areas within the concealment. In this invention, there may be (4) components to the airflow baffling. First, there is a baffle plate 18 which is under the RRH 22 and blocks any airflow from going around the air baffle pole 24. Second, the mounting bracket 26 that mounts the RRH to the pole is configured to also force air over the back of the RRH and any associated heatsink fins. The lower edge of the mounting bracket 26 may cooperate with the baffle plate 18 to direct airflow. Third, there is an air baffle hood 20 that forces the air out the exhaust perforation 14. Forth, there is a baffle 28 that closes off the inside of the radome and fills the gap between the radome 30 and the RRH 28 (Air Baffle-Radome). This baffle may be constructed out of a thermally conducive material that would allow the conduction of heat away from the RRH to the outside surface offering an additional cooling technique. (See FIGS. 2,3,4)

Once proper airflow is generated for each RRH module, the RRHs should be oriented so that the hot air exiting the exhaust perforation of one RRH module does not enter the inlet perforation of another RRH module. This is very important when stacking multiple configurations of RRHs. In this invention, each grouping of RRHs are equally spaced and assembled within a round concealed compartment. For example, if there are (3) RRH in a grouping, each RRH is angularly spaced 120 degrees from each other within the module. When stacking a second set of RRH above the first set or module, the RRHs would follow the same angular spacing as the module below, but the entire module would be rotated ½ the angular spacing of the RRHs as shown in FIG. 5. In this example the top module would be rotated 60 degrees from the module below. This same formula would apply regardless of the number of RRHs assembled and regardless of the number groupings of RRUs.

What is claimed is:

1. An apparatus comprising:
   a. a concealment module, the concealment module including an inlet panel and an outlet panel, the outlet panel located higher than the inlet panel;
   b. a remote radio head disposed with the concealment module, mounted on a support, and located between the inlet panel and the outlet panel;
   c. a first baffle, located under the remote radio head to prevent cool air from the inlet panel from being diverted to a space between the remote radio head and the support;
   d. a second baffle, located to direct cooling air over a back of the remote radio head;
   e. a third baffle, located on top of the remote radio head to direct heated cooling air to the outlet panel; and
   f. a fourth baffle, located to direct cooling air over the front of the remote radio head.

2. The apparatus of claim 1, wherein the second baffle further comprises a bracket for mounting the remote radio head to the support.

3. The apparatus of claim 1, wherein the fourth baffle further comprises a thermally conductive material, and thermally couples heatsink fins on the front of the remote radio head to the concealment module.

4. The apparatus of claim 1, wherein the concealment module includes a plurality of inlet panels and a plurality of outlet panels, the apparatus further comprising:
   a. a plurality of remote radio heads disposed with the concealment module;
   b. a plurality of second baffles, each associated with one of the plurality of remote radio heads;
   c. a plurality of third baffles, each associated with one of the plurality of remote radio heads and one of the plurality of outlet panels;
   d. a plurality of fourth baffles, each associated with one of the plurality of remote radio heads.

5. An concealed remote radio head assembly, comprising:
   a. a cylindrical concealment module, the concealment module including first, second and third pairs of perforated panels, wherein in each pair of perforated panel comprises an inlet panel and an outlet panel, wherein the outlet panel is located higher than the inlet panel, the pairs of perforated panels being substantially equally spaced about a circumference of the concealment module;
   b. first, second and third remote radio heads disposed with the concealment module, mounted on a support, each remote radio head associated with the respective first, second and third pairs of perforated panels;
   c. a first baffle, located under the first, second and third remote radio heads to prevent cool air from the inlet panels from being diverted to a space between the remote radio heads and the support;
   d. first, second and third mounting baffles, each mounting the respective first, second and third remote radio head to the support and configured to direct cooling air over a back of its respective remote radio head;
   e. first, second and third hood baffles, located on top of the respective first, second and third remote radio heads to direct heated cooling air to the respective first, second and third outlet panels; and
   f. first, second and third radome baffles, located to direct cooling air over the front of the respective first, second and third remote radio heads.

6. An assembly comprising first and second remote radio head assemblies as claimed in claim 5, wherein the second remote radio head assembly is located above the first remote radio head assembly, the first and second remote radio head assemblies being oriented rotationally such that the pairs of perforated panels of the second remote radio head assembly is offset from the pairs of perforated panels of the first remote radio head assembly.

7. A tower-mountable assembly, comprising:
   a. a cylindrical concealment module, the concealment module including first, second and third pairs of perforated panels, wherein in each pair of perforated panel comprises an inlet panel and an outlet panel, wherein the outlet panel is located higher than the inlet panel, the pairs of perforated panels being substantially equally spaced about a circumference of the concealment module;
   b. first, second and third electronics modules disposed with the concealment module, mounted on a support, each electronics module generating heat and being associated with the respective first, second and third pairs of perforated panels;
   c. a first baffle, located under the first, second and third electronics modules to prevent cool air from the inlet panels from being diverted to a space between the electronics modules and the support;
   d. first, second and third mounting baffles, each mounting the respective first, second and third electronics module to the support and configured to direct cooling air over a back of its respective electronics module; and
   e. first, second and third hood baffles, located on top of the respective first, second and third electronics modules to direct heated cooling air to the respective first, second and third outlet panels.

* * * * *